(12) United States Patent
Schwab et al.

(10) Patent No.: US 12,181,552 B2
(45) Date of Patent: Dec. 31, 2024

(54) DIFFUSION MAGNETIC RESONANCE IMAGING USING SPHERICAL NEURAL NETWORKS

(71) Applicant: KONINKLIJKE PHILIPS N.V., Eindhoven (NL)

(72) Inventors: Evan Schwab, Cambridge, MA (US); Arne Ewald, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 472 days.

(21) Appl. No.: 17/294,699

(22) PCT Filed: Nov. 19, 2019

(86) PCT No.: PCT/EP2019/081800
§ 371 (c)(1),
(2) Date: May 18, 2021

(87) PCT Pub. No.: WO2020/104457
PCT Pub. Date: May 28, 2020

(65) Prior Publication Data
US 2022/0011392 A1    Jan. 13, 2022

Related U.S. Application Data

(60) Provisional application No. 62/769,738, filed on Nov. 20, 2018.

(30) Foreign Application Priority Data

Dec. 20, 2018 (EP) .................................... 18214669

(51) Int. Cl.
*G01R 33/56* (2006.01)
*G01R 33/563* (2006.01)
(Continued)

(52) U.S. Cl.
CPC .................... *G01R 33/5608* (2013.01); *G01R 33/56341* (2013.01); *G06N 3/02* (2013.01); *G06V 10/764* (2022.01); *G06V 10/82* (2022.01)

(58) Field of Classification Search
CPC .......... G01R 33/5608; G01R 33/56341; G01R 33/20; G06N 3/02; A61B 5/055
See application file for complete search history.

(56) References Cited

U.S. PATENT DOCUMENTS

2005/0068031 A1  3/2005 Frank
2017/0052241 A1  2/2017 Cetingul et al.
(Continued)

FOREIGN PATENT DOCUMENTS

WO   2012125829 A2   9/2012
WO   2017221654 A1   12/2017

OTHER PUBLICATIONS

Masutani "Mathematical Foundations and Applications of Diffusion MRI Analysis" Graduate School of Information Sciences, Hiroshima City University, Feb. 6, 2016 (no translation available).
(Continued)

*Primary Examiner* — Serkan Akar
*Assistant Examiner* — Aminah Asghar

(57) ABSTRACT

The invention provides for a medical imaging system (100, 300). The medical imaging system comprises a memory (110) for storing machine executable instructions (120). The memory further contains an implementation of a trained convolutional neural network (122, 122', 122", 122''', 122''''). The trained convolutional neural network comprises more than one spherical convolutional neural network portions (502, 502'). The trained convolutional neural network is configured for receiving diffusion magnetic resonance imaging data (124). The diffusion magnetic resonance imaging data comprises a spherical diffusion portion (500, 500'). The more than one spherical convolutional neural
(Continued)

network portions are configured for receiving the spherical diffusion portion. The trained convolutional neural network comprises an output layer (508) configured for generating a neural network output (126) in response to inputting the diffusion magnetic resonance imaging data into the trained convolutional neural network. The medical imaging system further comprises a processor (104) for controlling the machine executable instructions. Execution of the machine executable instructions causes the processor to: receive (200) the diffusion magnetic resonance imaging data; and generate (202) the neural network output by inputting the diffusion magnetic resonance imaging data into the trained convolutional neural network.

16 Claims, 10 Drawing Sheets

(51) Int. Cl.
*G06N 3/02* (2006.01)
*G06V 10/764* (2022.01)
*G06V 10/82* (2022.01)

(56) References Cited

U.S. PATENT DOCUMENTS

| | | | | |
|---|---|---|---|---|
| 2019/0122074 | A1* | 4/2019 | Zhang | G06N 3/045 |
| 2019/0325746 | A1* | 10/2019 | Lewis | G06F 3/013 |
| 2020/0138382 | A1* | 5/2020 | Cao | G06T 7/0014 |

OTHER PUBLICATIONS

Cohen et al "Spherical CNNS" Proceedings of the 6th International Conference on Learning Representations (ICLR), 2018.

Enes Albay et al "Spherial CNN Based Brain Tissue Classification Using Diffusion MRI" Pen Review Dec. 12, 2018 p. 1-9.

Cheng Danni et al "Classification of MR Brain Images by Combination of Multi-CNNS for AD Diagnosis" Proceedings of SPIE, vol. 10420 Jul. 21, 2017 p. 1-5.

Kinyang Feng et al "Discriminative Anaysis of the Human Cortex Using Spherical CNNS . . . " Cornell University Library Dec. 19, 2018.

Koppers Simon et al "Direct Estimation of Fiber Orientations Using Deep Learning in Diffusion Imaging" International Conf. on Financial Cryptography and Data Security p. 53-60 Oct. 1, 2016.

Huan Lei et al "Spherical Convolutional Neural Network for 3D Point Clouds" May 21, 2018, p. 1-20 Cornell University Library.

K. H. Maier-Hein et al., "The challenge of mapping the human connectome based on diffusion tractography," Nature Communications, vol. 8, No. 1, p. 1349, Nov. 2017.

Esteves, Carlos, Christine Allen-Blanchette, Ameesh Makadia, and Kostas Daniilidis. "3D object classification and retrieval with Spherical CNNs." arXiv preprint arXiv:1711.06721 (2017).

Chakraborty et al "A CNN for Homogeneous Riemannian Manifolds with Applications to Neuroimaging" Aug. 6, 2018.

Christiaens et al "Convexity-Constrained and Nonnegativity-Constrained Spherical Factorization in Diffusion-Weighted Imaging" Neuroimage, 146 (2017) p. 507-517.

Seong et al "Geometric Confolutional Neural Network for Analyzing Surface Based Neuroimaging Data" Frontiers in Neuroinformatics Jul. 6, 2018.

Liprot et al "Rotationally Invariant Clustering of Diffusion MRI Data Using Spherical Harmonics" Proc. of SPIE, Mar. 21, 2016.

Prince D. Ngattai Lam, Gaetan Belhomme, Jessica Ferrall, Billie Patterson,Martin Styner, Juan C. Prieto, "TRAFIC: fiber tract classification using deep learning," Proc. SPIE 10574, Medical Imaging 2018: Image Processing, 1057412 (Mar. 2, 2018); doi: 10.1117/12.2293931.

Zhao et al "Modeling 4D FMRI Data via Spatio-Temporal Convlutional Neural Networks" Aug. 2018.

Nie et al "3D Deep Learning for Multimodal Imaging Guided Survival Time Prediction of Brain Tumor Patients" MICCAI 2016, Part II, pp. 212-220, 2016.

International Search Report and Written Opinion From PCT/EP2019/081800 Mailed May 28, 2020.

* cited by examiner

DIFFUSION MAGNETIC RESONANCE IMAGING USING SPHERICAL NEURAL NETWORKS

CROSS REFERENCE TO RELATED APPLICATIONS

This application is a U.S. national phase application of International Application No. PCT/EP2019/081800 filed on Nov. 19, 2019, which claims the benefit of U.S. Application Ser. No. 62/769,738 filed on Nov. 20, 2018 and EP Application Serial No. 18214669.6 filed on Dec. 20, 2018, each of which is incorporated herein by reference.

FIELD OF THE INVENTION

The invention relates to magnetic resonance imaging, in particular to diffusion magnetic resonance imaging.

BACKGROUND OF THE INVENTION

A large static magnetic field is used by Magnetic Resonance Imaging (MRI) scanners to align the nuclear spins of atoms as part of the procedure for producing images from within the body of a subject. This large static magnetic field is referred to as the B0 field or the main magnetic field. Various quantities or properties of the subject can be measured spatially using MRI. Various imaging protocols can be implemented by using pulse sequences to control the acquisition of magnetic resonance data. There exists diffusion weighted magnetic resonance imaging techniques where, for example, the diffusion tensor for different voxels can be measured.

The article Cohen et. al., "Spherical CNNs," arXiv: 1709.04893v2 discloses a method of constructing spherical CNNs that are both expressive and rotation equivariant. Within the article, spherical CNNs are exemplarily used for 3D shape recognition and atomization energy regression.

SUMMARY OF THE INVENTION

The invention provides for a medical imaging system, a computer program product, and a method in the independent claims. Embodiments are given in the dependent claims.

The analysis of diffusion weighted magnetic resonance images may require the manual definition of features such as fraction anisotropy (FA) from diffusion tensor imaging or fiber track quantities. Embodiments may provide for a means of fully automating such an analysis. This may for example be achieved by inputting the diffusion magnetic resonance imaging data from gradient directions acquired on a sphere into a spherical neural network. Spherical neural networks (also referred to herein as spherical convolutional neural networks) have a spherical topology for their input and at last some of its layers. Conventional convolutional neural networks typically have a planar input and typically planar layers.

The advantage of using the spherical neural network may be that they are better suited for processing diffusion magnetic resonance imaging data because they are able to deal with spherical data more effectively. A neural network which uses a planar input would use a projection of the spherical signal which would introduce space varying distortions that would render translational weight sharing impossible.

In one aspect the invention provides for a medical imaging system that comprises a memory for storing machine-executable instructions. The memory further contains or stores an implementation of a trained convolutional neural network. The trained convolutional neural network comprises at least one spherical convolutional neural network portion.

A spherical convolutional neural network as used herein encompasses a neural network that has a spherical input or layers instead of a 2D-planar input or layers. Patterns in the spherical convolutional neural network move as three-dimensional rotations instead of a translation.

The trained convolutional neural network is configured for receiving diffusion magnetic resonance imaging data. Diffusion magnetic resonance imaging data as used herein encompasses magnetic resonance imaging data that was acquired using a diffusion weighted magnetic resonance imaging protocol. The diffusion magnetic resonance imaging data comprises a spherical diffusion portion. At least one spherical convolutional neural network is configured for receiving the spherical diffusion portion. The trained convolutional neural network comprises an output layer configured for generating a neural network output in response to inputting the diffusion magnetic resonance imaging data into the trained convolutional neural network.

The medical imaging system further comprises a processor for controlling the machine-executable instructions. Execution of the machine-executable instructions further causes the processor to receive the diffusion magnetic resonance imaging data. In different examples this could be achieved in different ways. For example, the medical imaging system may acquire the diffusion magnetic resonance imaging data using a magnetic resonance imaging system. In other examples the medical imaging system may receive the diffusion magnetic resonance imaging data from a data source or via a network connection. Execution of the machine-executable instructions further causes the processor to generate the neural network output by inputting the diffusion magnetic resonance imaging data into the trained convolutional neural network. This embodiment may be beneficial because it may be useful for generating classifications of the diffusion magnetic resonance imaging data such as assigning certain properties or conditions to the diffusion magnetic resonance imaging data. In other instances, it may also be useful for processing or performing signal processing on the diffusion magnetic resonance imaging data. Diffusion itself may be three-dimensional in the values of the diffusion. Inputting this data into a spherical convolutional neural network may therefore provide better results as the spherical neural networks can accept spherical-dimensional data images without distortion.

The trained convolutional neural network could for example be trained by using labeled diffusion magnetic resonance imaging data.

References herein to at least one spherical convolutional neural network portion may be interpreted as being a reference to more than one spherical convolutional neural network.

In another embodiment, the diffusion magnetic resonance imaging data comprises voxels. The diffusion magnetic resonance imaging data comprises the spherical diffusion portion for each of the voxels. In other words, diffusion magnetic resonance imaging data is for a two- or three-dimensional volume. This two- or three-dimensional volume is formed from voxels. The voxels diffusion magnetic resonance image data has diffusion magnetic resonance imaging data with a spherical portion for each of these voxels. This embodiment may be beneficial because the data from each voxel may be individually input into the spherical convolutional neural network portions.

In another embodiment, the trained convolutional neural network comprises a spatial convolutional neural network portion. The spatial convolutional neural network portion comprises an input layer. The more than one spherical convolutional neural network portion each comprises a spherical neural network portion output. The spherical neural network portion output of each of the more than one spherical convolutional neural network portion is connected to the input layer of the spatial convolutional neural network portion. The output of each of the spherical neural networks is input to a conventional spatial convolutional neural network. This may be beneficial because the spatial convolutional neural network may be used to analyze patters of the output of the more than one spherical convolutional neural network portion.

In another embodiment each of the more than one spherical convolutional neural networks is a complete spherical convolutional neural network. Each of the more than one spherical convolutional neural networks may be a spherical convolutional neural network that is trained separately for a purpose such as providing a voxel class prediction or other use.

In another embodiment the more than one spherical convolutional neural network portion use weight sharing. Fore example, each of the more than one spherical convolutional neural networks may be identical. This may be beneficial because it may enable each of the voxels to the processed simultaneously.

In another embodiment the medical imaging system further comprises a magnetic resonance imaging system. The memory further contains pulse sequence commands for controlling the magnetic resonance imaging system to acquire magnetic resonance imaging acquisition data according to a diffusion weighted magnetic resonance imaging protocol. Execution of the machine-executable instructions further causes the processor to control the magnetic resonance imaging system with the pulse sequence commands to acquire the magnetic resonance acquisition data. Execution of the machine-executable instructions further causes the processor to reconstruct the diffusion magnetic resonance imaging data from the magnetic resonance acquisition data.

In another embodiment the neural network output comprises a global class prediction for the diffusion magnetic resonance imaging data at a global level. For example, the global class prediction may indicate the presence of certain types of anatomical anomalies for a condition which is imaged in the diffusion magnetic resonance imaging data.

In another embodiment the neural network output comprises a voxel class prediction for the diffusion magnetic resonance imaging data for individual voxels. For example, the medical imaging system may ascribe certain properties or classifications to individual voxels or groups of voxels within the diffusion magnetic resonance imaging data. This may for example be an aid in a physician performing a particular diagnosis or examination of the diffusion magnetic resonance imaging data.

In another embodiment the neural network output comprises a heat map pertaining to a localization of the neural network projected onto the diffusion magnetic resonance imaging data in a spatial and/or spherical domain to visualize the important spatial and/or spherical areas for the neural network prediction.

In another embodiment the neural network output comprises a heat map (as described above) projected onto a space of fiber tracts which is reconstructed through a tractography algorithm.

In another embodiment the trained convolutional neural network comprises a spatial convolutional neural network portion. A spatial convolutional neural network portion as used herein encompasses a normal convolutional neural network that is configured for receiving and processing two-dimensional or three-dimensional image data represented using a linear coordinate system.

The at least one spherical convolutional neural network portion comprises a spherical neural network portion output. The spatial convolutional neural network portion is connected between the spherical neural network portion output and the output layer.

In another embodiment the trained convolutional neural network comprises a spatial convolutional neural network portion. The single spherical convolutional neural network portion and the spatial convolutional neural network portion are combined. That is to say there may be portions of the convolutional neural network that have spherical convolutional layers and other portions which may have spatial, convolutional layers and they are interconnected. In one embodiment the at least one spherical convolutional neural network portion is a single spherical convolutional neural network portion.

In another embodiment the trained convolutional neural network comprises a spatial convolutional neural network portion. The at least one spherical convolutional neural network portion is connected to the output layer. The spatial convolutional neural network portion is connected to the output layer also. Both the at least one spherical convolutional neural network portion and the spatial convolutional neural network portion could both be connected to the output layer via one or more intermediate layers. This may be beneficial because this may enable different types of magnetic resonance imaging data to be used together. For example, a T1 weighted image may be input into the spatial convolutional neural network.

In another embodiment the trained convolutional neural network comprises a spatial convolutional neural network portion. The at least one spherical convolutional neural network portion and the spatial convolutional neural network portion are connected via weight sharing. The at least one spherical convolutional neural network portion is connected to the output layer. The spatial convolutional neural network portion is connected to the output layer also. Both the at least one spherical convolutional neural network portion and the spatial convolutional neural network portion could both be connected to the output layer via one or more intermediate layers.

In another embodiment each of the at least one spherical convolutional neural network portions are connected to an output concatenation. The output concatenation comprises or is the output layer. In this embodiment there is only the at least one spherical convolutional neural network portion. The use of one or more spherical convolutional neural networks may provide for an efficient means of processing diffusion weighted magnetic resonance imaging data.

In another embodiment at least one spherical convolutional neural network portion comprises multiple spherical convolutional neural network portions. The convolutional neural network comprises weight sharing between the multiple spherical convolutional neural network portions. This embodiment may be useful in diffusion weighted magnetic resonance imaging data because it may provide access or a means of analyzing multiple data for the same voxel.

In another embodiment each of the at least one spherical convolutional neural network portions represent measurements acquired at different gradient magnetic field values.

During the acquisition of magnetic resonance acquisition data, a gradient magnetic field is used. If different gradient magnetic fields are used during different acquisitions then this data can all be used for the same analysis if a different spherical neural network portion is used for each magnetic gradient field value.

In another embodiment the spherical diffusion portion is a diffusion signal for one or more gradient magnetic field values projected onto a sphere.

In another embodiment the diffusion magnetic resonance imaging data comprises diffusion tensor imaging data.

In another embodiment the diffusion magnetic resonance imaging data comprises high angular resolution diffusion imaging data.

In another embodiment the diffusion magnetic resonance imaging data comprises multi-shell high angular resolution diffusion imaging data.

In another embodiment the diffusion magnetic resonance imaging data comprises Q-ball imaging data.

In another embodiment the spherical diffusion portion comprises a diffusivity model calculated from a diffusion signal projected onto a sphere.

In another embodiment the diffusivity model is an orientation distribution function.

In another embodiment the diffusivity model is a fiber orientation distribution function.

In another embodiment the diffusivity model is an ensemble average propagator restricted to two or more concentric spheres.

In another aspect the invention provides for a computer program product comprising machine-executable instructions for execution by a processor controlling a medical imaging system. Execution of the machine-executable instructions causes the processor to receive a diffusion magnetic resonance imaging data. Execution of the machine-executable instructions further causes the processor to generate a neural network output by inputting the diffusion magnetic resonance imaging data into a trained convolutional neural network. The trained convolutional neural network comprises at least one spherical convolutional neural network portion. The trained convolutional neural network is configured for receiving the diffusion magnetic resonance imaging data. The diffusion magnetic resonance imaging data comprises a spherical diffusion portion. The at least one spherical convolutional neural network is configured for receiving the spherical diffusion portion. The trained convolutional neural network comprises an output layer configured for generating a neural network output in response to inputting the diffusion magnetic resonance imaging data into the trained convolutional neural network.

In another aspect the invention provides for a method of medical imaging. The method comprises receiving diffusion magnetic resonance imaging data. The method further comprises generating a neural network output by inputting the diffusion magnetic resonance imaging data into a trained convolutional neural network. The trained convolutional neural network comprises at least one spherical convolutional neural network portion. The trained convolutional neural network is configured for receiving diffusion magnetic resonance imaging data. The diffusion magnetic resonance imaging data comprises a spherical diffusion portion. The at least one spherical convolutional neural network is configured for receiving the spherical diffusion portion. The trained convolutional neural network comprises an output layer configured for generating a neural network output in response to inputting the diffusion magnetic resonance imaging data into the trained convolutional neural network. The advantages of this have been previously discussed.

In another embodiment the trained neural network is stored in the computer program product also.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) acquisition data is defined herein as being the recorded measurements of radio frequency signals emitted by atomic spins using the antenna of a Magnetic resonance apparatus during a magnetic resonance imaging scan. A Magnetic Resonance Imaging (MRI) image or magnetic resonance imaging data is defined herein as being the reconstructed two- or three-dimensional visualization of anatomic data reconstructed from magnetic resonance acquisition data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
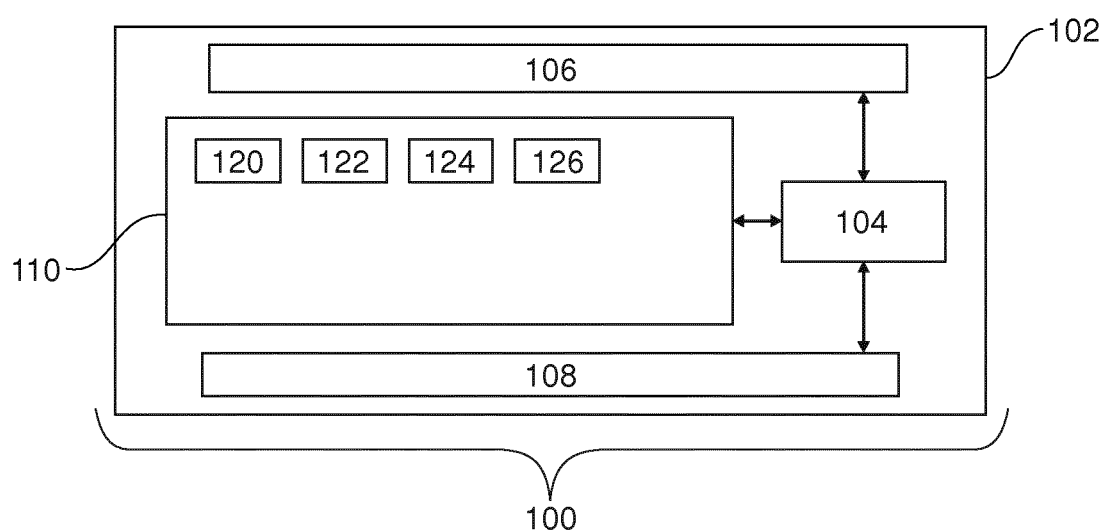
FIG. 1 illustrates an example of a medical imaging system.

FIG. 1 illustrates an example of a medical imaging system 100. The medical imaging system comprises a computer 102. The computer comprises a processor 104. The processor 104 is intended to represent one or more processors. If the processor 104 is multiple processors the processors may also be distributed within multiple computer systems 102. The processor is shown as being connected to an optional hardware interface 106 and an optional user interface 108. The optional hardware interface 106 enables the processor 104 to communicate with other computers and also possibly to control other components of a medical imaging system 100. The user interface 108 would enable the processor 104 to display or render images and other information which may be provided to a user or operator. The user interface 108 may also in some cases be used to receive control or input data from a user or operator.

The memory 110 is shown as containing machine-executable instructions 120. The machine-executable instructions 120 enable the processor 104 to optionally control other components of the medical imaging system 100 and also to perform various data processing and image processing tasks. The memory 110 is further shown as containing a trained neural network 122. The trained neural network is a convolutional neural network. The trained convolutional neural network 122 is configured for receiving diffusion magnetic resonance imaging data. The diffusion magnetic resonance imaging data comprises a spherical diffusion portion. The trained convolutional neural network comprises at least one spherical convolutional neural network portion. The at least one spherical convolutional neural network is configured for receiving the spherical diffusion portion of the diffusion magnetic resonance imaging data. The trained convolutional neural network further comprises an output layer configured for generating a neural network output in response to inputting the diffusion magnetic resonance imaging data into the trained convolutional neural network.

The memory 110 is further shown as containing diffusion magnetic resonance imaging data 124 that has been received. The computer memory 110 is further shown as containing a neural network output 126 that has been generated by inputting the diffusion magnetic resonance imaging data 124 into the trained convolutional neural network 122.

Figure 2:
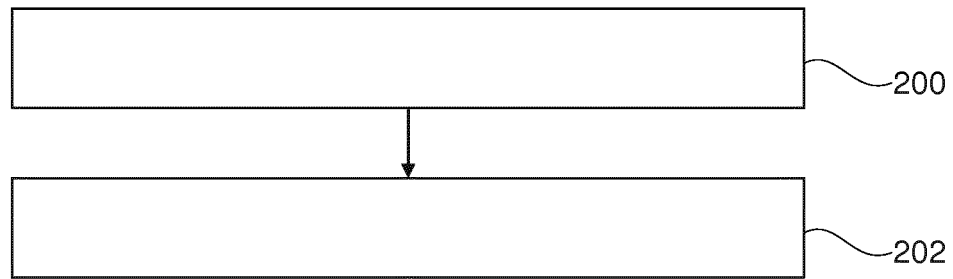
FIG. 2 shows a flow chart which illustrates a method of operating the medical imaging system of FIG. 1.

FIG. 2 shows a flowchart which illustrates a method of operating the medical imaging system 100 of FIG. 1. First in step 200 the diffusion magnetic resonance imaging data 124 is received. This for example could be received by controlling the magnetic resonance imaging system. It could also be received by receiving it via a network connection or other data storage medium. Next in step 202 the neural network output 126 is generated by inputting the diffusion magnetic resonance imaging data 124 into the trained convolutional neural network 122. The spherical diffusion portion is received by the at least one spherical portion of the convolutional neural network.

Figure 3:
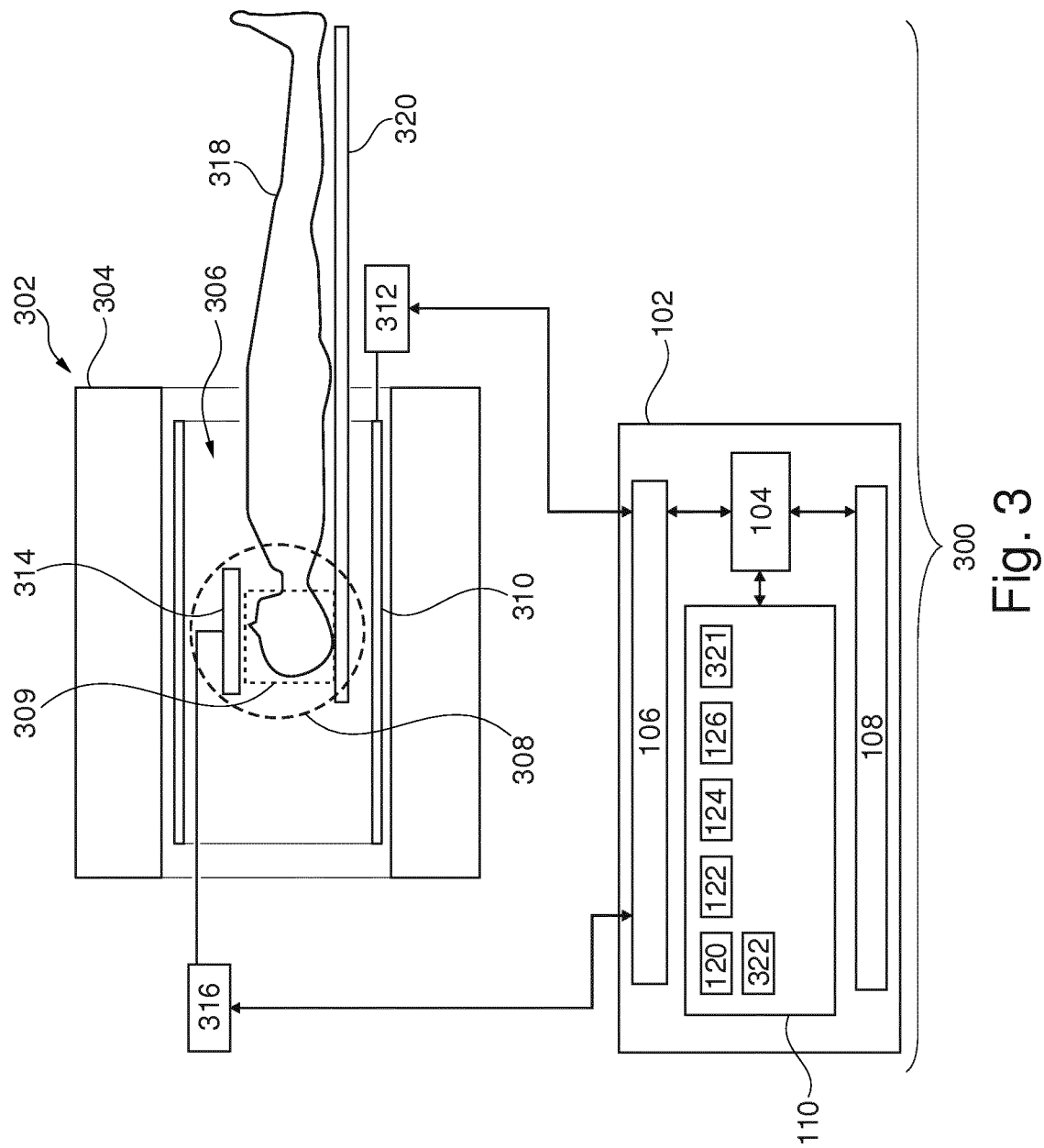
FIG. 3 illustrates a further example of a medical imaging system.

FIG. 3 illustrates a further example of a medical imaging system 300. The medical imaging system 300 comprises in addition to the computer system 102 a magnetic resonance imaging system 302. The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging. A region of interest 309 is shown within the imaging zone 308. The magnetic resonance data that is acquired typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

In this example the subject, 318 is positioned such that the subject's head region is within the region of interest 309. In other examples, other parts of the subject's 318 body may be positioned in the region of interest 309.

The transceiver 316 and the gradient controller 312 are shown as being connected to a hardware interface 106 of the computer system 102. The computer memory 110 is further shown as containing pulse sequence commands 321. The pulse sequence commands 321 are either instructions or data which can be converted into instructions which enable the processor 104 to control the magnetic resonance imaging system to acquire the magnetic resonance acquisition data 322. The memory 110 is further shown as containing magnetic resonance acquisition data 322 that has been acquired by controlling the magnetic resonance imaging system 302 with the pulse sequence commands 321.

Figure 4:
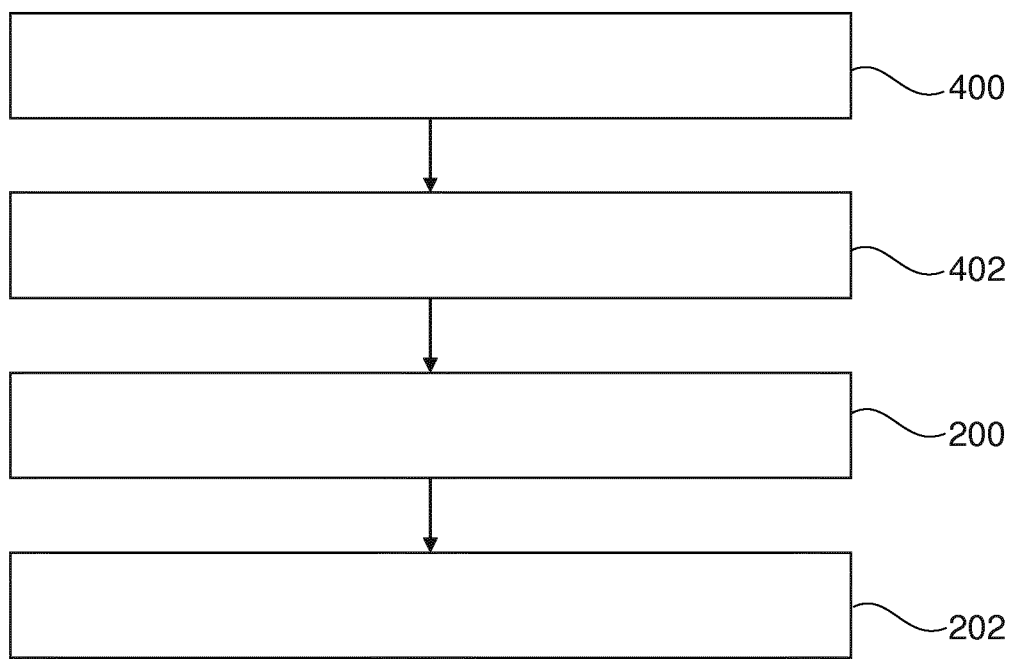
FIG. 4 shows a flow chart which illustrates a method of operating the medical imaging system of FIG. 3.

FIG. 4 shows a flowchart which illustrates a method of operating the medical imaging system 300 of FIG. 3. The method in FIG. 4 starts with step 400. In step 400 the magnetic resonance imaging system 302 is controlled with the pulse sequence commands 321. This results in the acquisition of the magnetic resonance acquisition data 322. Next in step 402 the diffusion magnetic resonance imaging data 124 is reconstructed from the magnetic resonance acquisition data 322. After step 402 the method proceeds to step 200 and then step 202 of the method illustrated in FIG. 2.

Figure 5:
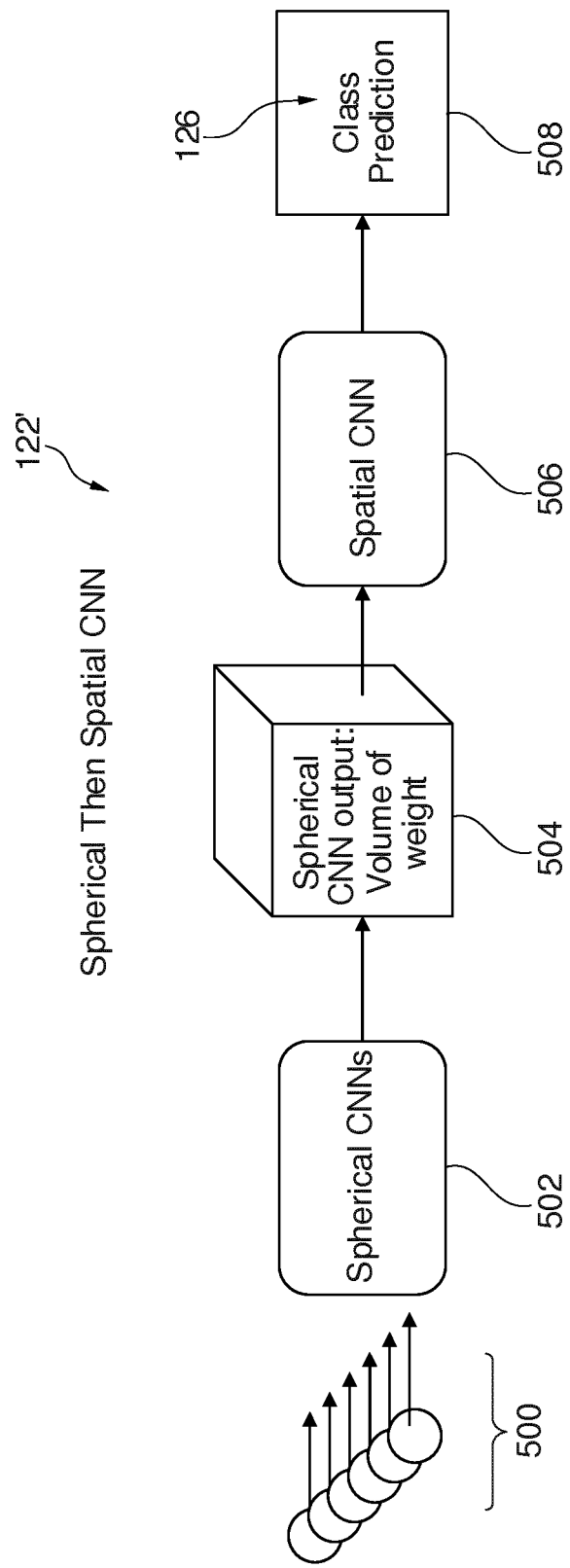
FIG. 5 illustrates an example of a trained convolutional neural network.

FIG. 5 illustrates a further example of a trained convolutional neural network 122'. In the example illustrated in FIG. 5 the trained convolutional neural network 122' comprises a spherical convolutional neural network portion 502 in series with a spatial convolutional neural network 506. In the example shown in FIG. 5 the spherical diffusion portion of the diffusion magnetic resonance imaging data 500 is first input into at least one spherical convolutional neural network portion 502. The output of the at least one spherical convolutional neural network portion 502 is the spherical neural network portion output 504 which is labeled the spherical CNN output or the volume of weights in the figure. The spherical neural network portion output 504 is then input into the spatial convolutional neural network 506. The spatial convolutional neural network 506 then outputs to an output layer 508 which provides one or more class predictions or classifications of the diffusion magnetic resonance imaging data.

Figure 6:
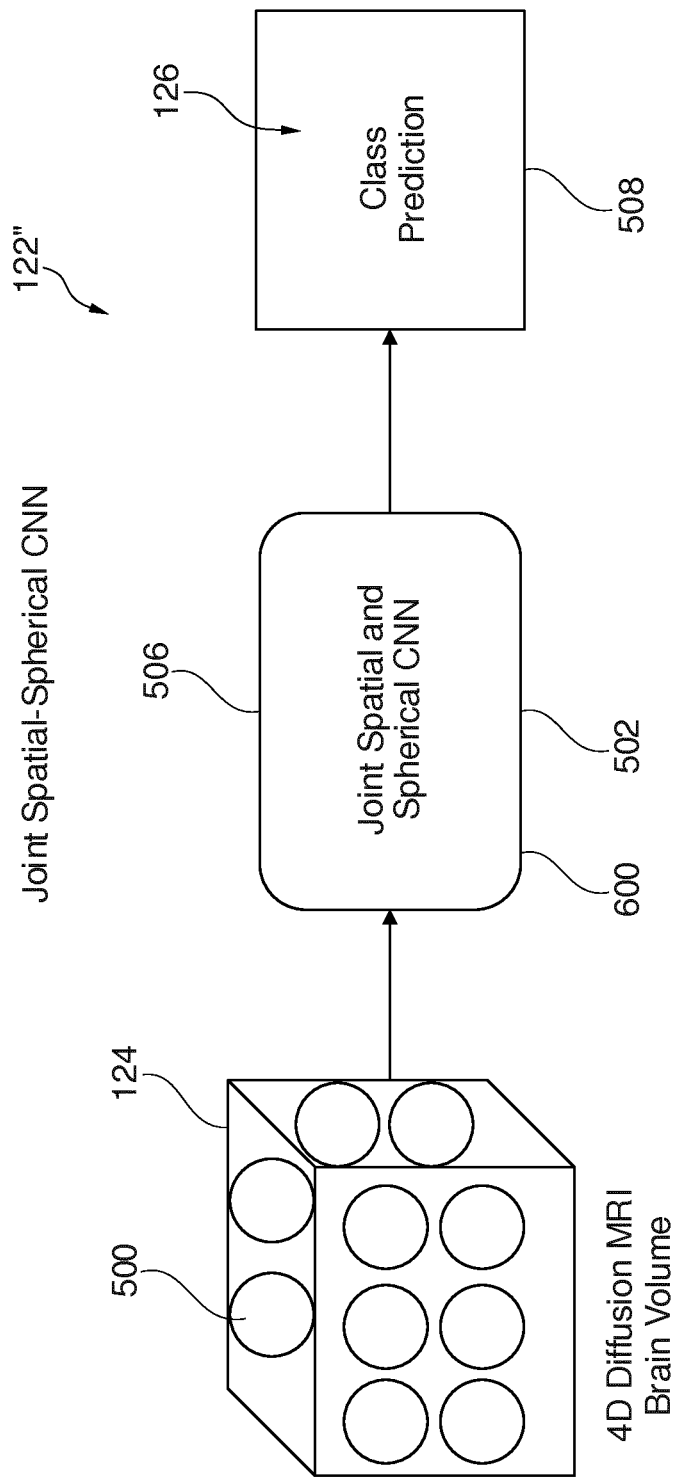
FIG. 6 illustrates a further example of a trained convolutional neural network.

FIG. 6 illustrates a further example of a trained convolutional neural network 122". In this example the diffusion magnetic resonance imaging data 124 comprises both spatial and a spherical diffusion portion 500. This is then input into a combined spherical and spatial neural network 600. It comprises both the spatial convolutional neural network 506 and the at least one spherical convolutional neural network portion 502. The portions of the neural network with spherical and planar topologies are intermixed. The output of the combined spherical and spatial neural network 600 is then output to the output layer 508 which provides the neural network output 126.

Figure 7:
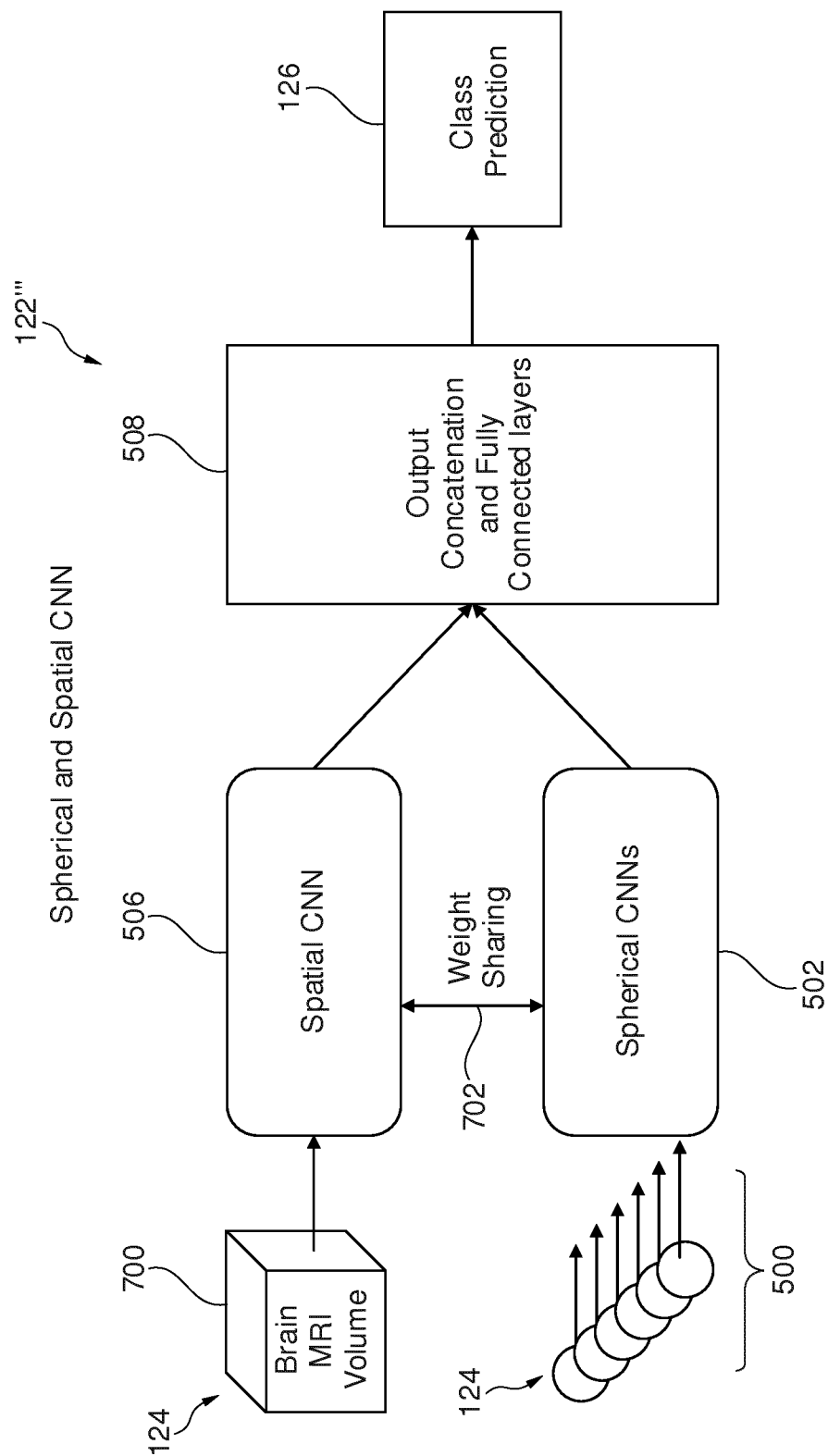
FIG. 7 illustrates a further example of a trained convolutional neural network.

FIG. 7 shows a further example of a trained convolutional neural network 122'''. In this example the diffusion magnetic resonance imaging data 124 comprises both a spherical diffusion portion and a spatial portion 700. The spherical diffusion portion 500 is input into at least one spherical convolutional neural network portion 502. The spatial portion 700 is input into a spatial convolutional neural network 506. The spatial convolutional neural network 506 and the spherical convolutional neural network 502 are able to communicate with each other via weight sharing 702. Both the spatial convolutional neural network 506 and the at least one spherical convolutional neural network portion 502 are connected to an output layer 508. The output layer 508 then provides the neural network output 126.

Figure 8:
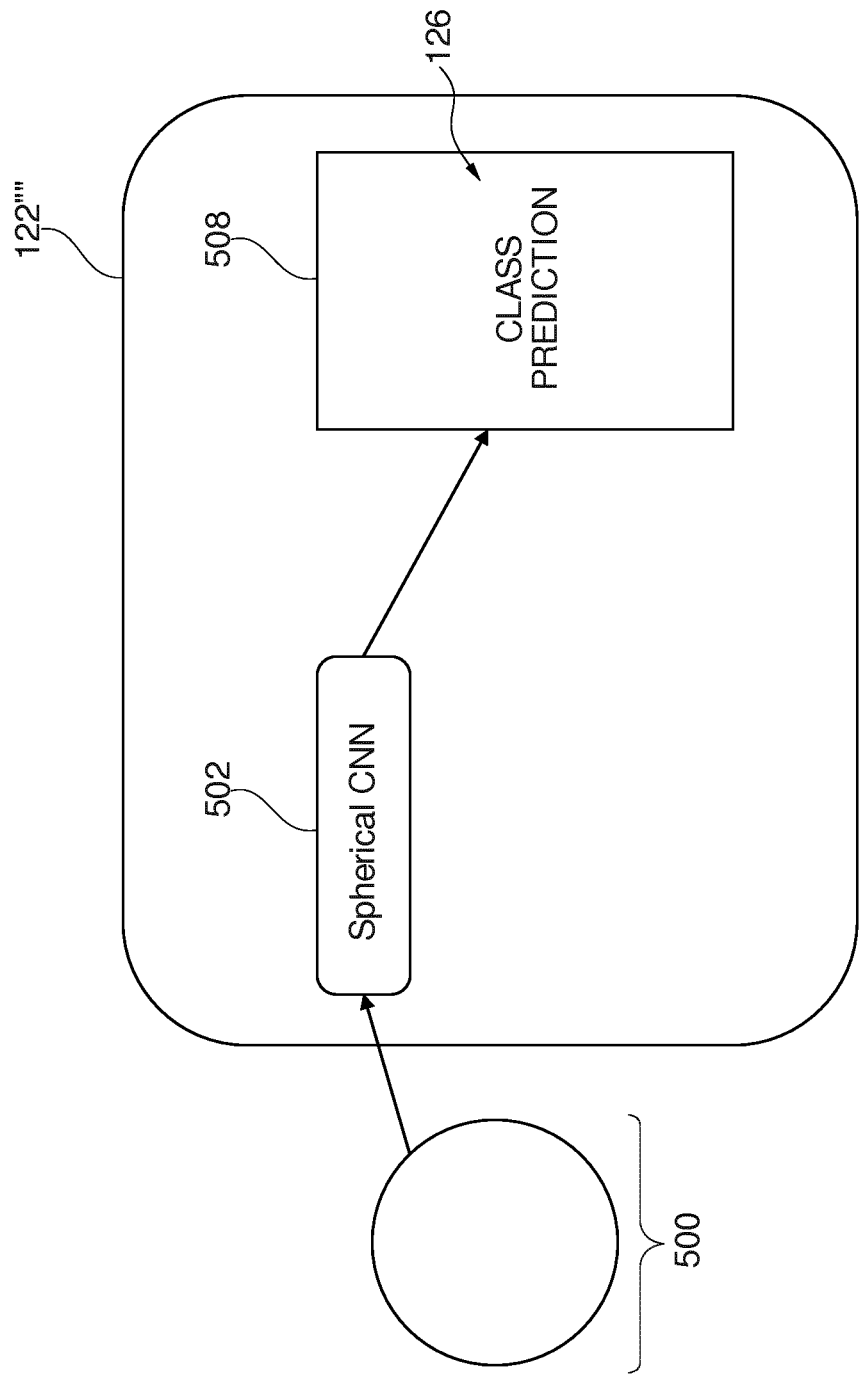
FIG. 8 illustrates a further example of a trained convolutional neural network.

FIG. 8 illustrates a further example of a trained convolutional neural network 122''''. The trained convolutional neural network 122'''' comprises at least one spherical convolutional neural network portion 502. This takes the spherical diffusion portion of the diffusion magnetic resonance imaging data 500 as input. The output of the at least one spherical convolutional neural network is then connected to the output layer 508 which provides the neural network output 126.

Figure 9:
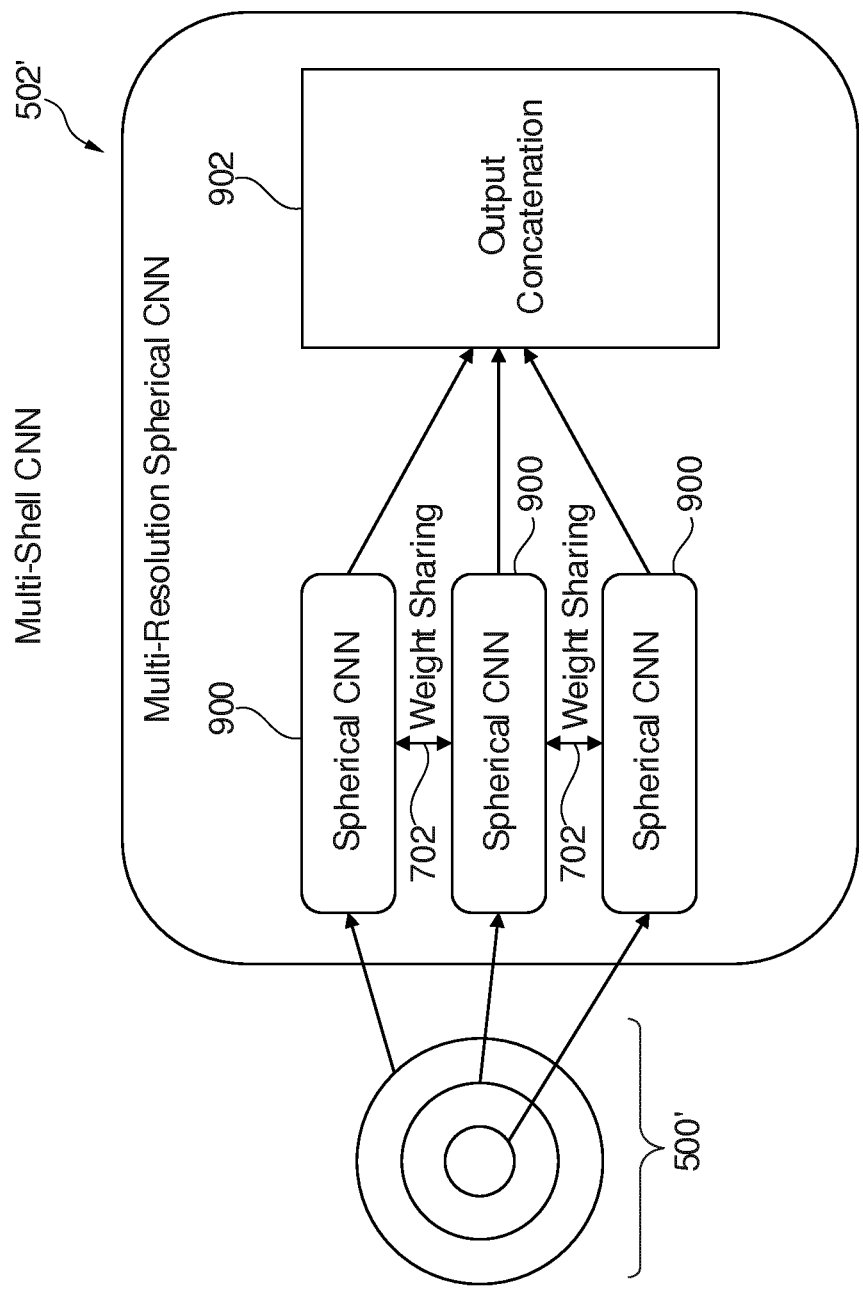
FIG. 9 illustrates an example of multiple shell spherical convolutional neural network.

FIG. 9 shows a modification of the at least one spherical convolutional neural network portion 502'. In this example the at least one spherical convolutional neural network portion 502' may be used to replace the at least one spherical convolutional neural network portion 502 that is depicted in FIGS. 5, 6, 7, and 8. In this example the spherical fusion portion is illustrated as 500'. This for example may be spherical diffusion data that is acquired for one or more gradient magnetic field values that were projected onto a sphere. For each of the individual values of the spherical diffusion portion is input into an individual or single spherical convolutional neural network portion 900. The individual or single spherical convolutional neural network portions 900 are able to communicate with each other via weight sharing 702. The output of each single spherical convolutional neural network portion 900 is output to an output concatenation 902. The output concatenation 902 may then be used to replace the output of any of the spherical convolutional neural networks 502 illustrated in FIG. 5, 6, 7 or 8.

Figure 10:
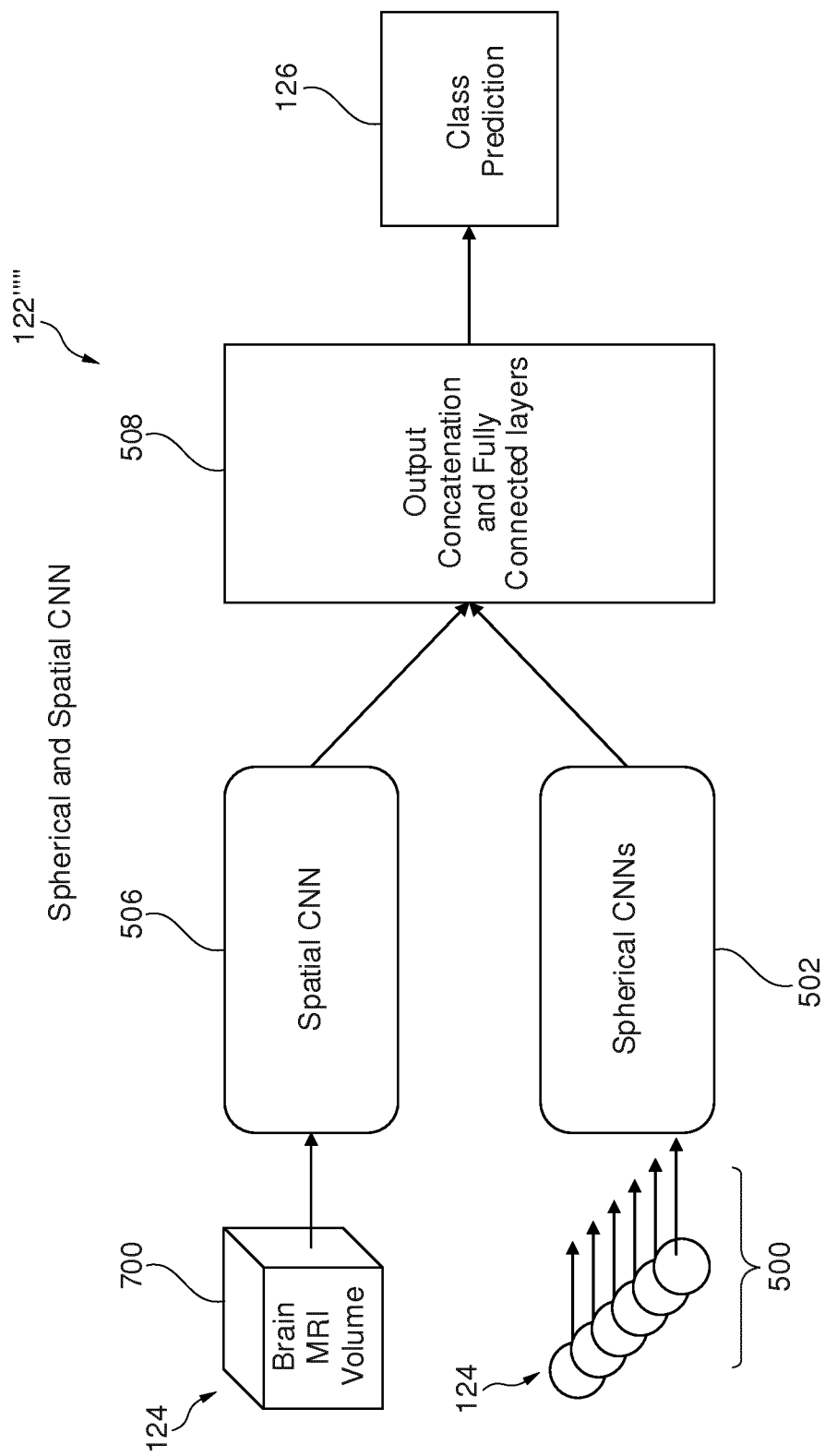
FIG. 10 illustrates a further example of a trained convolutional neural network.

FIG. 10 shows a further example of a trained convolutional neural network 122'''''. In this example the diffusion magnetic resonance imaging data 124 comprises both a spherical diffusion portion and a spatial portion 700. The spherical diffusion portion 500 is input into at least one spherical convolutional neural network portion 502. The spatial portion 700 is input into a spatial convolutional neural network 506. Both the spatial convolutional neural network 506 and the at least one spherical convolutional neural network portion 502 are connected to an output layer 508. The output layer 508 then provides the neural network output 126. This example may be useful when there are multiple types of magnetic resonance imaging data available. For example, the trained convolutional neural network may be trained to receive a T1 weighted image into the spatial CNN 506. The additional T1 weighted image may assist in providing a more accurate class prediction 126 or other prediction.

Diffusion Magnetic Resonance Imaging (dMRI) is an advanced neuroimaging modality that has been used to study neurological diseases such as Alzheimer's. In order to automatically classify diseases and identify important biomarkers in neuroimages, researchers rely on statistical analyses of hand-crafted features such as fractional anisotropy (FA) from diffusion tensor imaging (DTI) or fiber tract quantities which have produced varying and often inconclusive results for a number of clinical studies. To overcome the limitations of hand-crafted dMRI features, example may use deep learning framework for dMRI which applies a new framework of Spherical CNNs to diffusion signals combined with Spatial CNNs for automatic classification. Furthermore, by identifying the joint spherical and spatial artificial neurons activated during classification, examples may also provide for a novel fiber tract saliency map visualization to localize the spatial and directional segments of fiber tracts responsible for the disease classification.

As mentioned above, Diffusion MRI (dMRI) is a medical imaging modality used to reconstruct and visualize the anatomical network of neuronal fiber tracts in the brain, in vivo. Diffusion MRI measures directional quantities of water diffusion in the brain by acquiring a set of diffusion weighted images to estimate the orientation of bundles of neurons at each voxel of a brain volume. These orientation estimations are modelled by spherical probability distribution functions such as a 3D Gaussian distribution known as a diffusion tensor in diffusion tensor imaging (DTI) or a non-parametric orientation distribution function (ODF) in high angular resolution diffusion imaging. Fiber tracts are then reconstructed by following the peaks of these spherical PDFs in each voxel. This technology is important for analyzing anatomical brain connections, studying neurological and psychological disorders and discovering biomarkers for early detection of diseases such as Alzheimer's.

The gold standard in dMRI analysis is to extract hand-crafted features that are analytically computed from a pre-defined diffusion model, such as fractional anisotropy (FA) and mean diffusivity (MD) calculated from the eigenvalues of a diffusion tensor, which give an indication of the amount of diffusivity or integrity of a fiber in each voxel. Other common features are hand-crafted connectivity metrics from fiber tractography, such as the number, length, or density of fibers that connect different regions of interest.

With feature maps (i.e. images formed by a scalar feature at every voxel), the standard procedure is to run voxel-wise statistical analysis over a population of spatially aligned healthy and diseased subjects to find statistically significant differences between feature values in certain regions of interest of the brain. Then, explanations can be formed about physical properties of diffusivity which may be indicative of the disease based on the feature being studied.

However, many studies fall short of providing consistent biomarkers because of the ambiguity of scalar features like FA and MD, because 1) the diffusion tensor is unable to model more complex diffusivity profiles like crossing fibers, and 2) distilling high-dimensional diffusion signals into a few hand-crafted features discards much of the signals complexity. Furthermore, it has been shown that fiber reconstruction suffers from a false positive problem. Finally, due to the wide variability of fiber tractography between individuals and problems of false positive fiber tracts, fiber connectivity features may also be unreliable as disease biomarkers.

Examples may provide a framework for deep learning applied to dMRI brain data for the classification of neurological diseases and the localization and visualization of the disease features. The component utilizes CNNs that act on spherical diffusion data combined with CNNs that act in the spatial domain. By sharing network weights between the spherical and spatial domains, a tool for visualizing the spherical and spatial activations of the CNNs to highlight segments of fiber tracts responsible for the disease classification is introduced. With the advent of deep features and CNNs in the spherical domain, examples may overcome the current limitations of hand-crafted feature analysis such as FA and MD.

Examples may comprise deep neural networks that are uniquely constructed for the complex structure of diffusion MRI data. Here we consider that the structure of diffusion MRI consists of a field of diffusion signals at each voxel of a brain volume, each acquired on the unit sphere. Therefore, we have two signal domains: a spatial and spherical domain. This invention utilizes a recent computational framework for the construction of CNNs for spherical signals, known as Spherical CNNs. First, Spherical CNNs are applied to ODFs in each voxel. The result will be deep ODF feature maps for each Spherical CNN layer. Then, we apply the usual spatial CNN to each Spherical CNN layer to construct a joint spatial and spherical deep network for neurological disease classification which share network weights in the joint spatial-spherical domain.

Given a proposed disease classification, saliency mapping can be performed in a second step to identify the joint spatial and spherical artificial neurons from the deep network that are activated for disease classification. This will provide heat maps in the joint spatial and spherical domains from which diffusion directions and spatial voxels will be localized. Using tractography, we will project these heatmaps onto fiber tracts to visualize segments that are indicative of the disease classification. Additionally, fiber tractography could be guided (or weighed) by the spatial and spherical heatmap peaks to create new fiber tract visualizations related to disease.

Examples may be applicable to many applications for deep learning for diffusion MRI. From the construction of CNNs in the spherical and spatial domains, a number of commonly studied deep learning techniques could be employed for various tasks in tractography, fiber segmentation, and biomarker discover for neurological diseases.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer
104 processor
106 hardware interface
108 user interface
110 memory
120 machine executable instructions
122 trained convolutional neural network
122' trained convolutional neural network
122" trained convolutional neural network
122''' trained convolutional neural network
122'''' trained convolutional neural network
122''''' trained convolutional neural network
124 diffusion magnetic resonance imaging data
126 neural network output
200 receive the diffusion magnetic resonance imaging data
202 generate the neural network output by inputting the diffusion magnetic resonance imaging data into the trained convolutional neural network
300 medical imaging system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
321 pulse sequence commands
322 magnetic resonance acquisition data
400 control the magnetic resonance imaging system with the pulse sequence commands to acquire the magnetic resonance acquisition data
402 reconstruct the diffusion magnetic resonance imaging data from the magnetic resonance acquisition data
500 spherical diffusion portion of diffusion magnetic resonance imaging data
500' spherical diffusion portion of diffusion magnetic resonance imaging data
502 at least one spherical covoluational neural network portion
502' at least one spherical covoluational neural network portion
504 spherical neural network portion output
506 spatial convoluation neural network
508 output layer
600 combined spherical and spatial neural network
700 spatial portion of diffusion magnetic resonance imaging data
702 weight sharing
900 single spherical covoluational neural network portion
902 output concatenation

The invention claimed is:

1. A medical imaging system comprising:
a memory for storing machine executable instructions wherein the memory further contains an implementation of a trained convolutional neural network, wherein the trained convolutional neural network comprises a spatial convolutional neural network portion and more than one spherical convolutional neural network portions, wherein the trained convolutional neural network is configured for receiving diffusion magnetic resonance imaging data wherein the diffusion magnetic resonance imaging data comprises a spatial portion and a spherical diffusion portion, wherein the spatial convolutional neural network portion is configured for receiving the spatial portion and the more than one spherical convolutional neural network portions are configured for receiving the spherical diffusion portion, wherein the trained convolutional neural network comprises an output layer configured for generating a neural network output in response to inputting the diffusion magnetic resonance imaging data into the trained convolutional neural network;
a processor for controlling the machine executable instructions, wherein execution of the machine executable instructions causes the processor to:
receive the diffusion magnetic resonance imaging data;
generate the neural network output by inputting the diffusion magnetic resonance imaging data into the trained convolutional neural network
wherein the neural network output comprises at least one of the following:
a heatmap projected onto the diffusion magnetic resonance imaging data in a spatial and/or spherical domain;
a heatmap projected onto a space of fiber tracts reconstructed using a tractography algorithm; or
a global class prediction for the diffusion magnetic resonance imaging data at a global level,
wherein the more than one spherical convolutional neural network portions and the spatial convolutional neural network portion are connected in parallel to the output layer, and
wherein the more than one spherical convolutional neural network portions and the spatial convolutional neural network portion are interconnected via weight sharing, providing visualization of spherical and spatial activations of the trained convolutional neural network to highlight segments of the fiber tracts responsible for disease classification that overcomes limitations of manual feature analysis.

2. The medical imaging system of claim 1, wherein the diffusion magnetic resonance imaging data comprises voxels, wherein the diffusion magnetic resonance imaging data comprises the spherical diffusion portion for each of the voxels.

3. The medical imaging system of claim 1, wherein the spatial convolutional neural network portion and each of the more than one spherical convolutional neural network portions has an output that is each connected to an output concatenation, and wherein the output concatenation comprises the output layer.

4. The medical imaging system of claim 1, wherein the more than one spherical convolutional neural network portions comprise multiple spherical convolutional neural network portions, wherein the convolutional neural network comprises weight sharing between the multiple spherical convolutional neural network portions.

5. The medical imaging system of claim 4, wherein each of the multiple spherical convolutional neural network portions are measurements acquired at a different gradient magnetic field value.

6. The medical imaging system of claim 1, wherein the spherical diffusion portion is a diffusion signal for one or more gradient magnetic field values projected onto a sphere.

7. The medical imaging system of claim 6, wherein the diffusion magnetic resonance imaging data comprises any one of the following:
   diffusion tensor imaging data;
   angular resolution diffusion imaging data;
   multi shell angular resolution diffusion imaging data; and
   Q-Ball imaging data.

8. The medical imaging system of claim 1, wherein the spherical diffusion portion comprises a diffusivity model calculated from a diffusion signal projected onto a sphere.

9. The medical instrument of claim 8, wherein the diffusivity model is any one of the following:
   an orientation distribution function;
   a fiber orientation distribution function; and
   an ensemble average propagator restricted to two or more concentric spheres.

10. The medical imaging system claim 1, wherein the medical imaging system further comprises a magnetic resonance imaging system, wherein the memory further contains pulse sequence commands for controlling the magnetic resonance imaging system to acquire magnetic resonance acquisition data according to a diffusion weighted magnetic resonance imaging protocol, wherein execution of the machine executable instructions causes the processor to:
   control the magnetic resonance imaging system with the pulse sequence commands to acquire the magnetic resonance acquisition data; and
   reconstruct the diffusion magnetic resonance imaging data from the magnetic resonance acquisition data.

11. A non-transitory computer readable medium comprising machine executable instructions stored therein for execution by a processor controlling a medical imaging system,
   wherein execution of the machine executable instructions causes the processor to:
   receive diffusion magnetic resonance imaging data;
   generate a neural network output by inputting the diffusion magnetic resonance imaging data into a trained convolutional neural network, wherein the trained convolutional neural network comprises a spatial convolutional neural network portion and more than one convolutional neural network portions, wherein the trained convolutional neural network is configured for receiving the diffusion magnetic resonance imaging data, wherein the diffusion magnetic resonance imaging data comprises a spatial portion and a spherical diffusion portion, wherein the spatial convolutional neural network portion is configured for receiving the spatial portion and the more than one spherical convolutional neural network portions are configured for receiving the spherical diffusion portion, wherein the trained convolutional neural network comprises an output layer configured for generating the neural network output in response to inputting the diffusion magnetic resonance imaging data into the trained convolutional neural network
   wherein the neural network output comprises at least one of the following:
   a heatmap projected onto the diffusion magnetic resonance imaging data in a spatial and/or spherical domain;
   a heatmap projected onto a space of fiber tracts reconstructed using a tractography algorithm; or
   a global class prediction for the diffusion magnetic resonance imaging data at a global level, and
   wherein the more than one spherical convolutional neural network portions and the spatial convolutional neural network portion are connected in parallel to the output layer, and
   wherein the more than one spherical convolutional neural network portions and the spatial convolutional neural network portion are interconnected via weight sharing, providing visualization of spherical and spatial activations of the trained convolutional neural network to highlight segments of the fiber tracts responsible for disease classification that overcomes limitations of manual feature analysis.

12. The computer program product of claim 11, wherein the diffusion magnetic resonance imaging data comprises voxels, wherein the diffusion magnetic resonance imaging data comprises the spherical diffusion portion for each of the voxels.

13. The non-transitory computer readable medium of claim 11, wherein the spatial convolutional neural network portion and each of the more than one spherical convolutional neural network portions has an output that is each connected to an output concatenation, and wherein the output concatenation comprises the output layer.

14. A method of medical image processing, wherein the method comprises:
   receiving diffusion magnetic resonance imaging data;
   generating the neural network output by inputting the diffusion magnetic resonance imaging data into the trained convolutional neural network wherein the trained convolutional neural network comprises a spatial convolutional neural network portion and more than one spherical convolutional neural network portions, wherein the trained convolutional neural network is configured for receiving the diffusion magnetic resonance imaging data, wherein the diffusion magnetic resonance imaging data comprises a spatial portion and a spherical diffusion portion, wherein the spatial convolutional neural network portion is configured for receiving the spatial portion and the more than one spherical convolutional neural network portions are configured for receiving the spherical diffusion portion, wherein the trained convolutional neural network comprises an output layer configured for generating the neural network output in response to inputting the diffusion magnetic resonance imaging data into the trained convolutional neural network
   wherein the neural network output comprises at least one of the following:
   a heatmap projected onto the diffusion magnetic resonance imaging data in a spatial and/or spherical domain;
   a heatmap projected onto a space of fiber tracts reconstructed using a tractography algorithm; or
   a global class prediction for the diffusion magnetic resonance imaging data at a global level, and wherein the more than one spherical convolutional neural network portions and the spatial convolutional neural network portion are connected in parallel to the output layer, and wherein the more than one spherical convolutional neural network portions and the spatial convolutional neural network portion are interconnected via weight sharing, providing visualization of spherical and spatial activations of the trained convolutional neural network to highlight segments of the fiber tracts responsible for disease classification that overcomes limitations of manual feature analysis.

15. The method of medical image processing of claim 14, wherein the diffusion magnetic resonance imaging data comprises voxels, wherein the diffusion magnetic resonance imaging data comprises the spherical diffusion portion for each of the voxels.

16. The method of medical image processing of claim 14, wherein the spatial convolutional neural network portion and each of the more than one spherical convolutional neural network portions has an output that is each connected to an output concatenation, and wherein the output concatenation comprises the output layer.

* * * * *